United States Patent [19]

Jung et al.

[11] Patent Number: 5,768,213
[45] Date of Patent: Jun. 16, 1998

[54] CLOCK GENERATING CIRCUIT FOR USE IN SEMICONDUCTOR MEMORY DEVICE

[75] Inventors: Woo-Seop Jung, Kyungki-do; Gyu-Hong Kim, Seoul, both of Rep. of Korea

[73] Assignee: Samsung Electronics Co., Ltd., Suwon, Rep. of Korea

[21] Appl. No.: 669,700

[22] Filed: Jun. 24, 1996

[30]  Foreign Application Priority Data

Jun. 30, 1995 [KR]  Rep. of Korea ............... 18972/1995

[51] Int. Cl.$^6$ ................................................. G11C 8/00
[52] U.S. Cl. ................. 365/233; 365/230.01; 365/233.5
[58] Field of Search ........................... 365/233, 233.5, 365/230.01

[56]  References Cited

U.S. PATENT DOCUMENTS 4,945,516  7/1990  Kashiyama ...................... 365/189.05
4,953,131  8/1990  Purdham et al. .................... 365/222
5,335,206  8/1994  Kawamoto ........................ 365/233.5
5,563,843  10/1996  Fackenthal et al. ............... 365/233.5

*Primary Examiner*—David C. Nelms
*Assistant Examiner*—Hien Nguyen
*Attorney, Agent, or Firm*—Marger, Johnson, McCollom & Stolowitz, P.C.

[57]  ABSTRACT

In a semiconductor memory integrated circuit device, power consumption and clock noise are reduced by providing a plurality of separately controlled internal clock signal generators. All of the internal clock signal generators receive an external clock signal, so as to provide respective internal clock signals that are synchronized with the external clock signal. However, each of the internal clock signal generators is separately controlled depending upon the present operating mode of the memory, so that individual internal clock signals are generated only when required.

20 Claims, 2 Drawing Sheets

CLOCK GENERATING CIRCUIT FOR USE IN SEMICONDUCTOR MEMORY DEVICE

BACKGROUND OF THE INVENTION

1. Field of the Invention

The present invention relates to a clock generating circuit of a synchronous dynamic random access memory (hereinafter, referred to as SDRAM) which operates in synchronization with a system clock from an external system and, in particular, to a clock generating circuit for selectively supplying an internal clock signal to a function block only when the function block is activated.

The present application is based on and claims priority from Korean Application No. 18972/1995 which is incorporated herein by reference for all purposes.

2. Description of the Related Art

Conventionally, an SDRAM is referred to as a synchronous dynamic random access memory. It provides access to data stored in a memory array at a high speed in synchronization with an externally applied system clock, e.g. a central processing unit (CPU) clock. Such an SDRAM is disclosed in a Korean Patent Application No. 1993-7127 filed by Samsung Electronics. Ltd. on Apr. 27, 1993, the same assignee as in the present invention.

The SDRAM as described above includes an internal clock generator for generating an internal clock signal in synchronization with the system clock from the external system. The internal clock signal provides an operating clock source for each internal "function block" that operates in sync with the external system clock. Such function blocks can include, for example, a data output buffer, a row address input buffer, and a column address input buffer, a write block, etc. Various function blocks are illustrated in the above Korean Patent Application No. 1993-7127 and are known in semiconductor memory designs.

A prior art clock generating circuit for generating the internal clock signal in synchronization with the external clock and for supplying the generated clock to each function block as described above, comprises a single internal clock generator on board the chip, as shown in FIG. 1.

FIG. 1 is a diagram illustrating the structure of a clock generating circuit for use in a prior art semiconductor memory device, which is constructed with an internal clock generator 12 for generating an internal clock signal in synchronization with the system clock CLK inputted from the external system. A clock buffer 18 is provided for converting the generated internal clock signal into an appropriate (e.g. CMOS) voltage level and driving the internal clock signal into a plurality of function blocks 14, 16 to 16$i$ (where i is an integer).

As illustrated in FIG. 1, each of the function blocks 14, 16 to 16$i$ is activated in response to a respective control signal FCTLj (where j is 14,16 . . . 16$i$) so as to provide the corresponding function. By way of an example, if function block 14 provides data output, the function block 14 accesses the data of the memory cell and outputs the accessed read data to an output pad in synchronization with the internal clock supplied from the clock buffer 18, upon assertion of the control signal FCTL14. As stated previously, a plurality of the function blocks 16 to 16$i$ each operate in synchronization with the internal clock in response to activation of corresponding control signals FCTL 16 to FCTL16$i$, respectively.

FIG. 2 is a timing diagram illustrating the output of the clock generating circuit of FIG. 1. Referring to FIG. 2, once the external system clock CLK is applied to the clock generating circuit of FIG. 1, the internal clock generator 12 generates and outputs the internal clock $\phi$CLK in synchronization with the system clock CLK. The internal clock signal generated as shown in FIG. 2 is provided as an input to the clock buffer 18. The clock buffer 18 buffers the internal clock signal and synchronizes the respective function blocks 14, 16 to 16$i$. While receiving the buffered internal clock, the function blocks 14, 16 to 16$i$, respectively, process their corresponding signals in synchronization with the internal clock upon activation of their corresponding control signals FCTLj.

However, an SDRAM using the clock generating circuit as described above provides the internal clock in synchronization with the external system clock CLK, from the single clock generator to a plurality of function blocks. This results in substantial loading on the internal clock, requiring the buffer circuit 18 to drive that load. Moreover, clock buffer 18 and necessary distribution of the internal clock signal throughout the device from a single source can cause delay, thereby compromising speed of operation of the memory.

Further, in as much as only one clock generator 12 is used in the clock generating circuit of FIG. 1, the same internal clock signal is always applied to all of the various function blocks, regardless of their respective clocking needs. Thus, clocking is continuous throughout the device, even though some of the function blocks have no need for clocking all of the time. Consequently, current consumption in the device is greater than necessary for proper operation and unnecessary noise is generated. For example, while the internal clock for controlling the output of the data is required only during the read mode of operation, the internal clock supplied to the corresponding block may be toggled continuously in the prior art, even during operations other than the read mode, thereby generating the unnecessary current consumption. In conclusion, the stable operation of the semiconductor memory device is less than optimal.

SUMMARY OF THE INVENTION

It is therefore an object of the present invention to provide an internal clock generating circuit for minimizing current consumption in an SDRAM.

It is another object of the present invention to provide a clock generating circuit for generating an internal clock necessary at a corresponding function block only upon activation of the function block that requires the clock signal.

Another object of the present invention to reduce internal clock noise in a synchronous dynamic random access memory.

A further object of the invention is to provide a plurality of internal clock generating circuits in a synchronous dynamic random access memory, and selectively activate such clock generating circuits only as actually needed.

According to one aspect of the invention, a semiconductor memory device includes a clock input for receiving an external clock signal; a plurality of function blocks; and a control signal generator for providing a respective control signal for selectively activating each of the function blocks to carry out a corresponding function. In the device, a plurality of separate clock generator circuits are also deployed, each clock generator circuit being coupled to the clock input to receive the external clock signal and coupled to a corresponding one of the function blocks to provide a respective internal clock signal that is synchronized with the external clock signal, for clocking the corresponding function block. Each clock generator circuit has a control input coupled to receive the control signal that activates the corresponding function block, so as to activate the clock generator circuit only when the corresponding function block is activated. In other words, when a given function block is idle, so too is the corresponding clock generating circuit idle, thereby reducing wasted power and noise.

The function blocks can include, for example, data buffers, a column address buffer, a row address buffer, a data output buffer, and the like. Any function that requires an internal clock signal but does not run continuously can be provided with a separately controllable clock generator circuit as further described herein.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF A PREFERRED EMBODIMENT

Throughout the drawings, it is noted that the same reference numbers are used to designate like or equivalent elements having the same function. Further, in the following description, several specific details are set forth to provide a more through understanding of the present invention. It will be apparent, however, to one skilled in the art that the present invention may be practiced without these specific details. The detailed description of known function and constructions unnecessarily obscuring the subject matter of the present invention are avoided.

Figure 1:
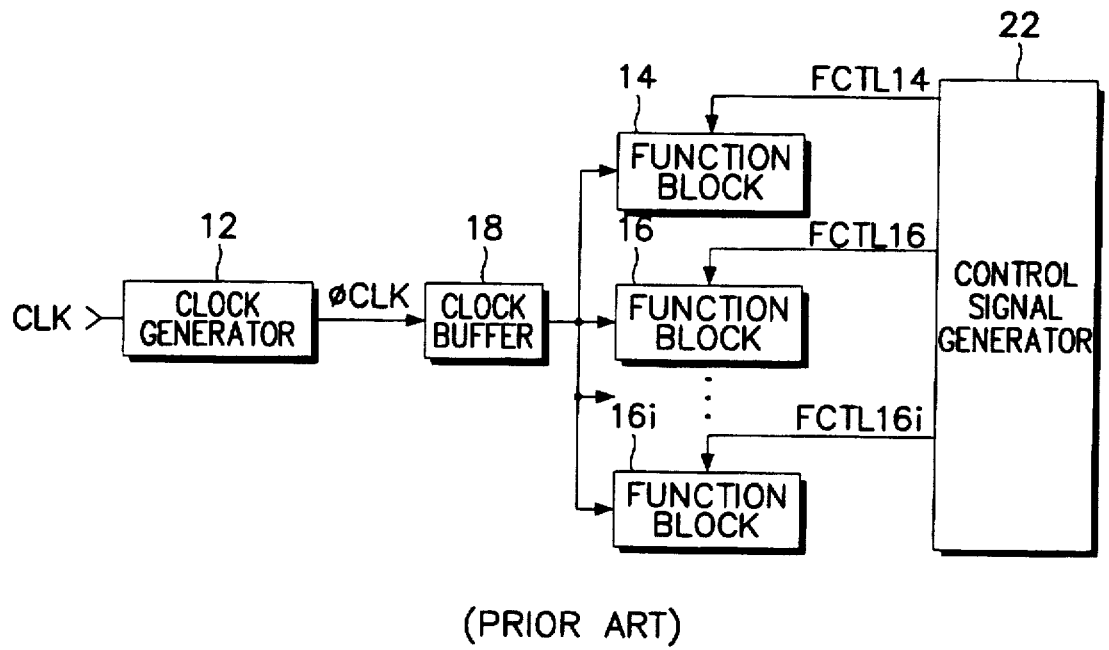
FIG. 1 is a diagram illustrating a clock generating circuit for use in a prior art semiconductor memory device.
Figure 3:
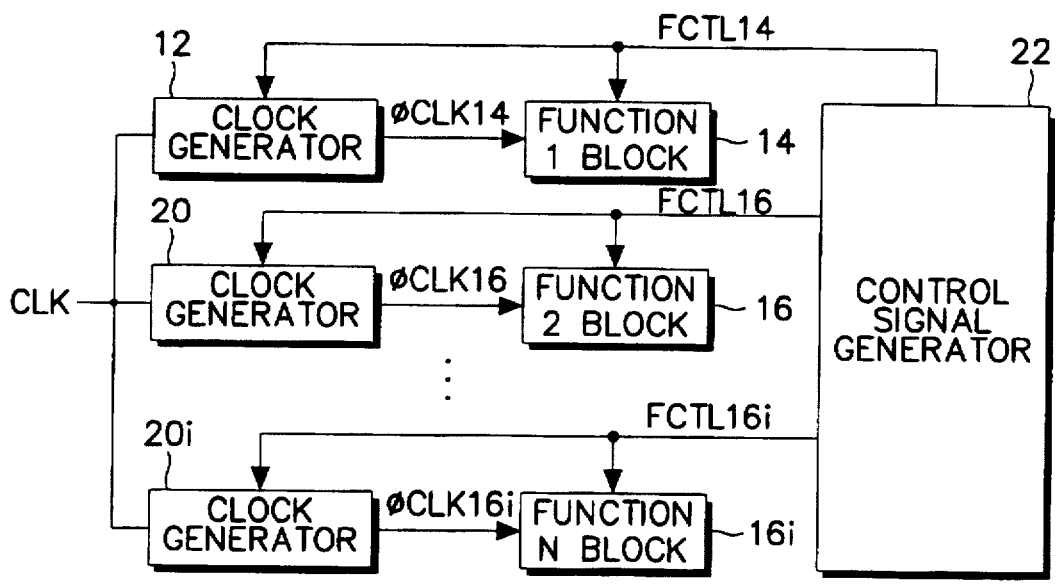
FIG. 3 is a diagram illustrating the construction of a clock generating circuit for use in a semiconductor memory device according to the present invention.
Figure 2:
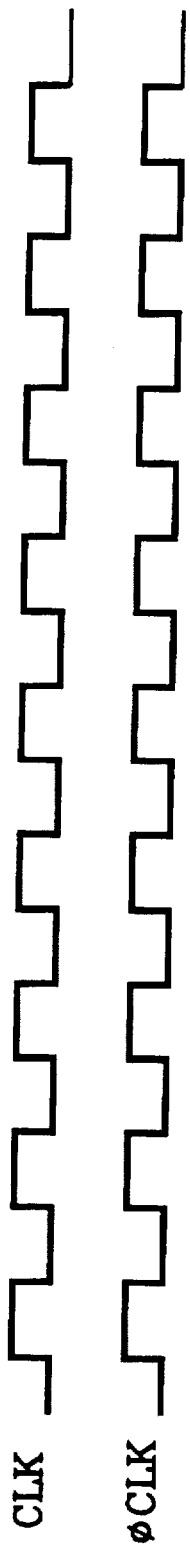
FIG. 2 is a timing diagram illustrating the output of the clock generating circuit of FIG. 1.

FIG. 3 is a diagram illustrating the construction of clock generating circuits for use in a semiconductor memory device according to the present invention. The drawing represents a plurality of function blocks 14, 16 to 16i for providing various functions, in response to a respective internal clock signal, say φCLK14, and a corresponding control signal FCTLj (where J=14,16 . . . 16i). Multiple clock generator circuits 12, 20 to 20i each receive the external or system clock signal CLK and provides a corresponding one of the internal clock signals, synchronized to the external clock signal. Each of the clock generator circuits has a control input coupled to receive the control signal that activates the corresponding function block, so as to selectively activate each clock generator circuit only when the corresponding function block is activated.

Figure 4:
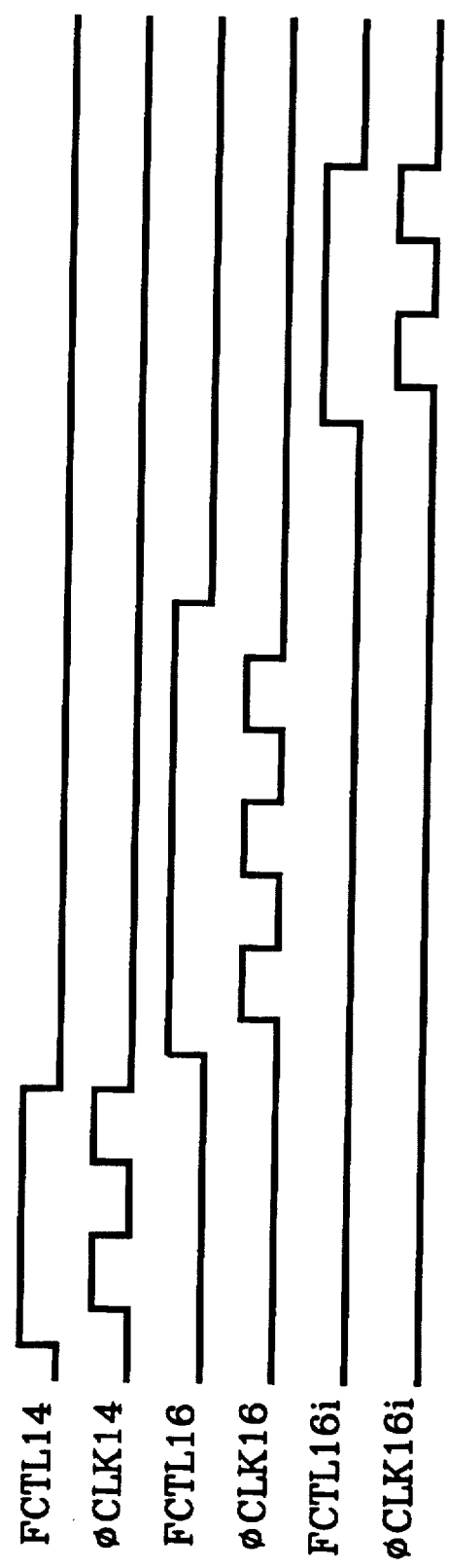
FIG. 4 is a timing diagram illustrating the output of the clock generating circuit of FIG. 3.

FIG. 4 is a timing diagram illustrating the outputs of the various clock generating circuits of FIG. 3. Each internal clock signal is selectively generated from the clock generators 12, 20 to 20i in response to a corresponding one of the function control signals FCTLj for controlling each of the function blocks 14, 16 to 16i.

As depicted in FIG. 3, a control signal generator 22 detects an active mode of operation of the memory device in accordance with input states of various of input signals (not shown), e.g. a write control signal WR, a read control signal RD, and address strobe signals, RAS, CAS etc. and then generates function control signals FCTL4, FCTL16 to FCTL16i for controlling the function blocks 14, 16 to 16i, as illustrated in FIG. 4, to carry out the detected mode of operation.

As stated above, the control signals FCTLj generated from the control signal generator 22 are respectively inputted to the corresponding function blocks 14, 16 to 16i and to the clock generators 12, 20 to 20i corresponding to the function blocks 14, 16 to 16i, respectively. The clock generators 12, 20 to 20i generates the internal clocks in synchronization with the system clock CLK inputted from the external and thus, provide the generated internal clocks to their corresponding function clocks 14, 16 to 16i, but only when the corresponding control signals FCTLj are asserted.

For instance, once the control signal FCTL14 for operating the function block 14 is enabled as a "high" state as shown in FIG. 4, the clock generator 12 provides the internal clock to the function block 14. The function block 14 is driven by the same enabled control signal FCTL14 and the generated internal clock, thereby performing its specific function.

Supposing that the control FCTL16 input to the function block 16 is enabled as the "high" state as shown in FIG. 4, operations of the clock generators 12 and 20i are terminated, so that the clock generator 16 alone provides the internal clock necessary to drive the selected function block 16. Therefore, the internal clock signal is input only in the function block which is currently active in accordance with the active mode among a plurality of function blocks, the current consumption attributable to the toggling of an unnecessary clock is reduced. In other words, the methodology of the present invention includes a step of terminating the internal clock signal as to each function block when the corresponding internal control signal that activates the said function block is no longer asserted.

As can be seen from FIG. 3, if we assume that the function block 14 corresponds to a data output buffer, a more concrete example is as follows. Among a plurality of the function blocks positioned in the interior of the chip of the SDRAM, the data output buffer for transmitting the data of the memory cell to the output pad operates only during a read mode of operation. When the read control signal is asserted from outside the chip and the control signal FCTL14 asserted by the control signal generator 22, only the clock generator 12 is active, as illustrated in the waveforms of FIG. 4. As a result, the data output from the memory cell is synchronized to the internal clock and transmitted to the output pad. Because the function blocks 16 to 16i and the corresponding clock generators 20 to 20i (both of which have no relation to the data output mode of operation) do not operate, the toggling and the generation of the unnecessary clock signals can be avoided, thereby reducing the current consumption.

As apparent from the foregoing, the present invention can be achieved with a clock generating circuit in a SDRAM, wherein clocks corresponding to a plurality of function blocks operated by input of the external clock are individually supplied by activation of their corresponding function control signals, so that the current consumption can be prevented due to the toggling of the unnecessary clock, thereby preventing the noise from being generated by the clock toggling.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment discloses as the best mode contemplated for carrying out the present invention, but that the present invention includes all embodiments falling within the scope of the appended claims.

We claim:

1. A synchronous semiconductor memory device comprising:

a clock input for receiving a periodic external clock signal;

a plurality of function blocks;

a control signal generator for providing a respective control signal for selectively activating each of the function blocks to carry out a corresponding function;

a plurality of clock generator circuits, each clock generator circuit coupled to the clock input to receive the periodic external clock signal and coupled to a corresponding one of the function blocks to provide a respective periodic internal clock signal, synchronized with the external clock signal, for clocking the corresponding function block;

each clock generator circuit having a control input coupled to receive the control signal that activates the corresponding function block, and including means for enabling the clock generator to generate the said periodic internal clock signal while the corresponding control signal is asserted and for disabling the clock generator so that it does not generate the said periodic internal clock signal while the corresponding control signal is not asserted, thereby reducing power consumption in the memory device.

2. A synchronous semiconductor memory device according to claim 1 wherein the number of clock generator circuits is equal to the number of function blocks so as to form a one-to-one correspondence between the clock generator circuits and the function blocks.

3. A synchronous semiconductor memory device according to claim 1 wherein the function blocks include a memory read function block, whereby, in operation, a memory read clock generator circuit is activated so as to provide a periodic internal clock signal to the memory read function block only while the memory read function block is activated.

4. A synchronous semiconductor memory device according to claim 1 wherein the function blocks include a column address input buffer, whereby, in operation, a clock generator circuit is activated so as to provide a periodic internal clock signal to the column address input buffer only while the column address input buffer is activated.

5. A synchronous semiconductor memory device according to claim 1 wherein the function blocks include a memory write function block, whereby, in operation, a memory write clock generator circuit is activated so as to provide a periodic internal clock signal to the memory write function block only while the memory write function block is activated.

6. A synchronous semiconductor memory device according to claim 1 wherein the function blocks include a data output buffer, whereby, in operation, a clock generator circuit is activated so as to provide a periodic internal clock signal to the data output buffer only while the data output buffer is activated.

7. A synchronous semiconductor memory device according to claim 1 wherein the function blocks include a row address input buffer, whereby, in operation, a clock generator circuit is activated so as to provide a periodic internal clock signal to the row address input buffer only while the row address input buffer is activated.

8. A method of internally clocking a synchronous semiconductor memory integrated circuit having a plurality of internal function blocks, comprising the steps of:

providing separate internal control signals for selectively activating each of the internal function blocks;

continuously clocking each internal function block as long as the corresponding internal control signal that activates the said function block is asserted; and terminating said clocking each function block when the respective internal control signal that activates the said function block is no longer asserted, thereby reducing unnecessary internal clock signals.

9. A method according to claim 8 wherein the synchronous semiconductor memory integrated circuit internal function blocks include a memory read function block; and said clocking step comprises clocking the memory read function block only while the memory read internal control signal is asserted.

10. A method according to claim 8 wherein the synchronous semiconductor memory integrated circuit internal function blocks include a memory write function block; and said clocking step comprises clocking the memory write function block only while the memory write internal control signal is asserted.

11. A method according to claim 8 wherein the synchronous semiconductor memory integrated circuit internal function blocks include a column address input buffer; and said clocking step comprises clocking the column address input buffer only while the column address input buffer internal control signal is asserted.

12. A method according to claim 8 wherein the synchronous semiconductor memory integrated circuit internal function blocks include a row address input buffer; and said clocking step comprises clocking the row address input buffer only while the row address input buffer internal control signal is asserted.

13. A method according to claim 8 wherein the synchronous semiconductor memory integrated circuit internal function blocks include a data output buffer; and said clocking step comprises clocking the data output buffer only while the data output buffer internal control signal is asserted.

14. A synchronous semiconductor memory integrated circuit internal clock system comprising:

input means for receiving a periodic external clock signal;

a plurality of clock generator circuits, each coupled to the input means, for providing various internal clock signals each synchronized with the external clock signal; and control means coupled to the clock generator circuits for selectively enabling each of the clock generator circuits to generate the corresponding internal clock signal only while a corresponding function block in the integrated circuit requires the corresponding internal clock signal, thereby reducing power consumption attributable to internal clock signals running when they are not needed.

15. A synchronous semiconductor memory integrated circuit internal clock system according to claim 14 wherein the control means includes a control signal generator circuit that provides a respective control signal to each of the clock generator circuits.

16. A synchronous semiconductor memory integrated circuit internal clock system according to claim 14 wherein the control means includes a control signal generator circuit that provides a plurality of control signals, each control signal being coupled to both a respective function block and to a corresponding one of the clock generator circuits so as to activate the corresponding clock generator circuit when the said function block is activated.

17. A synchronous semiconductor memory integrated circuit internal clock system according to claim 14 wherein one of the function blocks comprises a memory read function block.

18. A synchronous semiconductor memory integrated circuit internal clock system according to claim 14 wherein one of the function blocks comprises a data output buffer.

19. A synchronous semiconductor memory integrated circuit internal clock system according to claim 14 wherein one of the function blocks comprises a row address input buffer.

20. A synchronous semiconductor memory integrated circuit internal clock system according to claim 14 wherein one of the function blocks comprises a column address input buffer.

* * * * *